US010575428B2

(12) United States Patent
Rivnay et al.

(10) Patent No.: US 10,575,428 B2
(45) Date of Patent: Feb. 25, 2020

(54) SERVER SYSTEM

(71) Applicant: Amazon Technologies, Inc., Seattle, WA (US)

(72) Inventors: Roey Rivnay, Seattle, WA (US); Darin Lee Frink, Lake Tapps, WA (US); Christopher Strickland Beall, Woodinville, WA (US); Felipe Enrique Ortega Gutierrez, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/823,498

(22) Filed: Nov. 27, 2017

(65) Prior Publication Data
US 2018/0084665 A1 Mar. 22, 2018

Related U.S. Application Data

(63) Continuation of application No. 15/087,746, filed on Mar. 31, 2016, now Pat. No. 9,832,905.

(51) Int. Cl.
G06F 1/16 (2006.01)
H05K 5/00 (2006.01)
H05K 7/00 (2006.01)
H05K 7/14 (2006.01)

(52) U.S. Cl.
CPC ................. H05K 7/1485 (2013.01)

(58) Field of Classification Search
CPC .. H05K 7/1485; H05K 7/1488; H05K 7/1489; H05K 7/1492

USPC ............. 361/679.41–679.44, 724–727, 361/679.33–679.39
See application file for complete search history.

(56) References Cited

U.S. PATENT DOCUMENTS

| 5,222,897 A * | 6/1993 | Collins ............... H05K 7/1409 361/801 |
| 6,134,113 A | 10/2000 | Mills et al. |
| 6,285,545 B1 | 9/2001 | Lopez |
| 6,487,071 B1 | 11/2002 | Tata et al. |
| 6,618,254 B2 * | 9/2003 | Ives ................. G06F 1/184 174/535 |

(Continued)

OTHER PUBLICATIONS

U.S. Appl. No. 15/058,103, filed Mar. 1, 2016, Darin Lee Frink.
(Continued)

Primary Examiner — Anthony M Haughton
(74) Attorney, Agent, or Firm — Robert C. Kowert; Kowert, Hood, Munyon, Rankin & Goetzel, P.C.

(57) ABSTRACT

A system includes a rack and one or more server systems mounted in the rack. A server system includes at least one sever node and each server node includes an array of devices including mass storage devices and at least one server device. Segments of the array of devices of a particular server node are mounted in sub-node chassis that include intra node connectors. Multiple sub-node chassis that each include devices such as mass storage devices or server devices of the sever node couple together via the intra node connectors when installed in a server system chassis to form a server node. Each server node of a server system may be a separate logical node. Also, the sub-node chassis of a server node may be configured for vertical airflow through the sub-node chassis in addition to cross airflow.

20 Claims, 10 Drawing Sheets

(56) References Cited

U.S. PATENT DOCUMENTS

| | | | | |
|---|---|---|---|---|
| 6,654,241 B2 * | 11/2003 | Hillyard | ............... | G06F 1/16 312/223.1 |
| 6,804,877 B2 * | 10/2004 | Mueller | ............ | G11B 15/6835 29/603.01 |
| 7,656,671 B2 * | 2/2010 | Liu | ................. | G06F 1/185 361/735 |
| 7,685,613 B2 | 3/2010 | Permut et al. | | |
| 7,701,704 B2 | 4/2010 | Huang et al. | | |
| 8,508,930 B2 | 8/2013 | Peng et al. | | |
| 8,902,579 B1 | 12/2014 | Lalouette | | |
| 9,832,905 B2 | 11/2017 | Rivnay et al. | | |
| 2006/0132964 A1 * | 6/2006 | Lau | ................. | G11B 25/10 360/92.1 |
| 2006/0134997 A1 * | 6/2006 | Curtis | ............... | G11B 33/126 439/700 |
| 2011/0007464 A1 * | 1/2011 | Leigh | ............... | H01R 9/2408 361/679.01 |
| 2012/0116590 A1 | 5/2012 | Florez-Larrahondo et al. | | |
| 2015/0181748 A1 | 6/2015 | Bailey et al. | | |

OTHER PUBLICATIONS

U.S. Appl. No. 14/217,149, filed Mar. 17, 2014, David Edward Bryan.
U.S. Appl. No. 14/217,124, filed Mar. 17, 2014, David Edward Bryan.
U.S. Appl. No. 14/217,121, filed Mar. 17, 2014, David Edward Bryan.

* cited by examiner

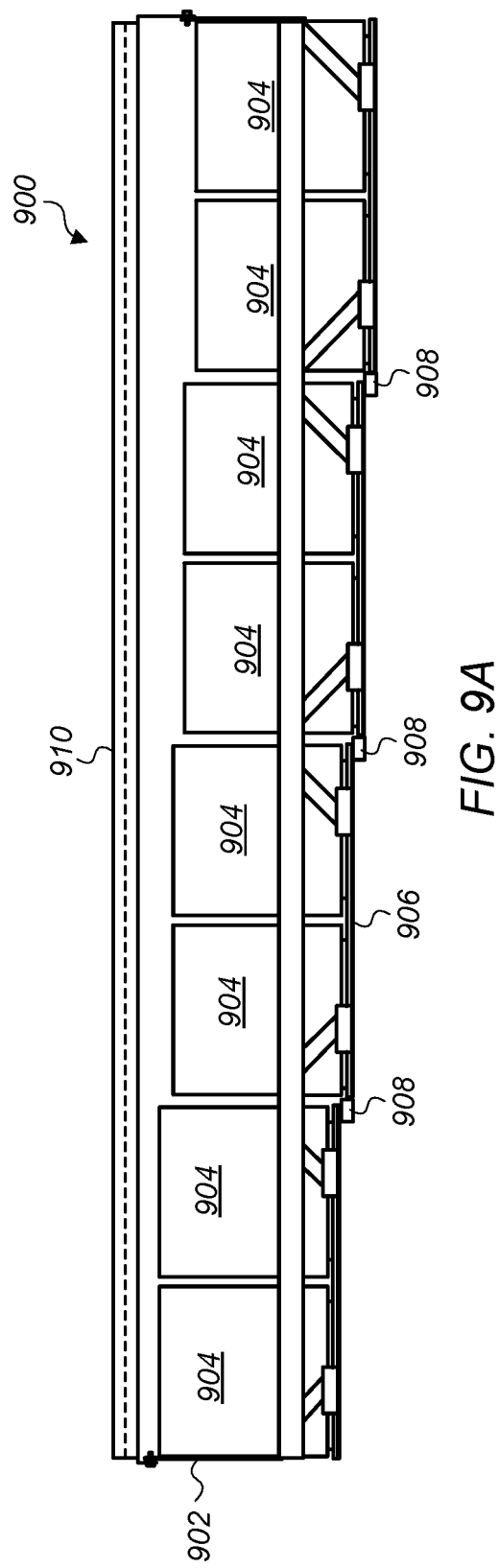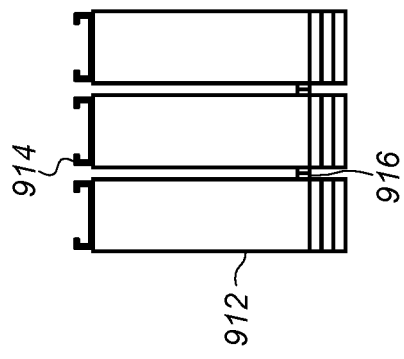
FIG. 9A
FIG. 9B

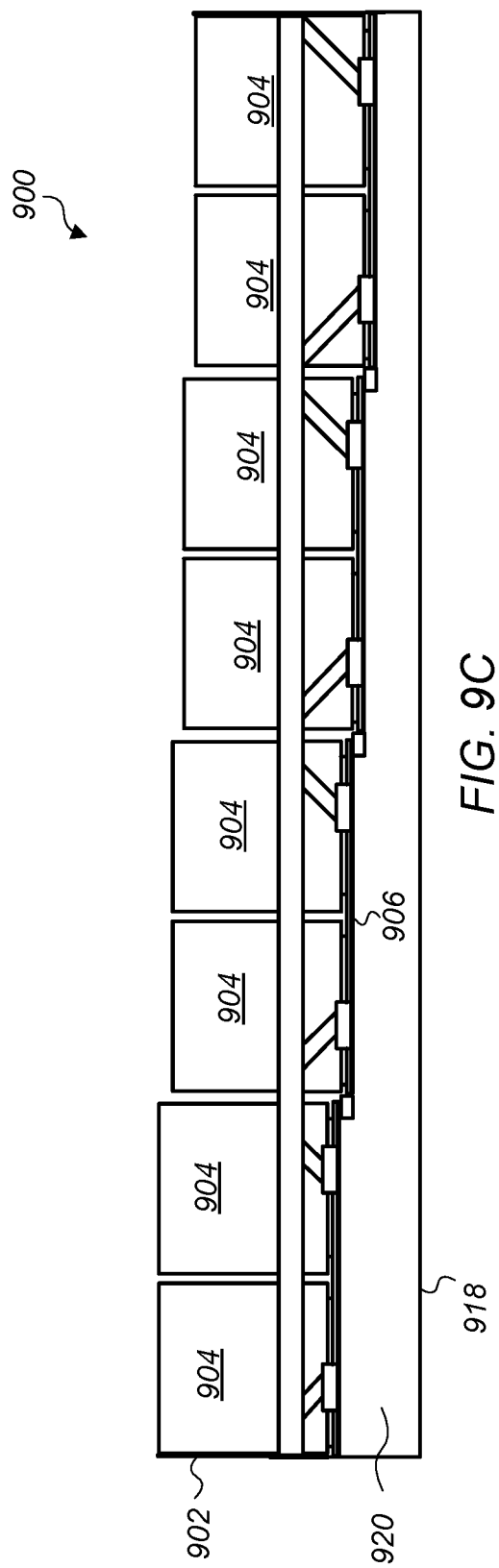

SERVER SYSTEM

This application is a continuation of U.S. patent application Ser. No. 15/087,746, filed Mar. 31, 2016, now U.S. Pat. No. 9,832,905, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components, such components include printed circuit boards, mass storage devices, power supplies, and processors. Some known computer systems include a plurality of large, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some computer systems are rack mounted servers that include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in a server chassis. This wasted space, especially when multiplied over many servers in a rack, may result in inadequate computing or storage capacity for a system.

Some servers that include a number of hard disk drives use a centralized controller to control accesses to the hard disk drives, such as reads and writes. In such server designs using a centralized controller, a failure of the controller or ancillary equipment associated with the controller, may cause all the hard disk drives of the server to be unreachable. This reduces the reliability of the server.

Also some servers that include a number of hard disk drives may include a large number of hard disk drives mounted on a common chassis. Such servers may be heavy, in some cases weighing 75 lbs. or more. Furthermore, rack systems in which such servers are to be mounted may include elevated slots that require lifting the servers overhead or to other elevated positions. Lifting such heavy servers may be less than desirable due to ergonomic risks and safety risks.

BRIEF DESCRIPTION OF THE DRAWINGS

FIG. 9A illustrates a side view of a sub-node chassis, according to some embodiments.

FIG. 9B illustrates a front view of multiple sub-node chassis coupled together via intra node connectors, according to some embodiments.

FIG. 9C illustrates a side view of a sub-node chassis, according to some embodiments.

Figure 1:
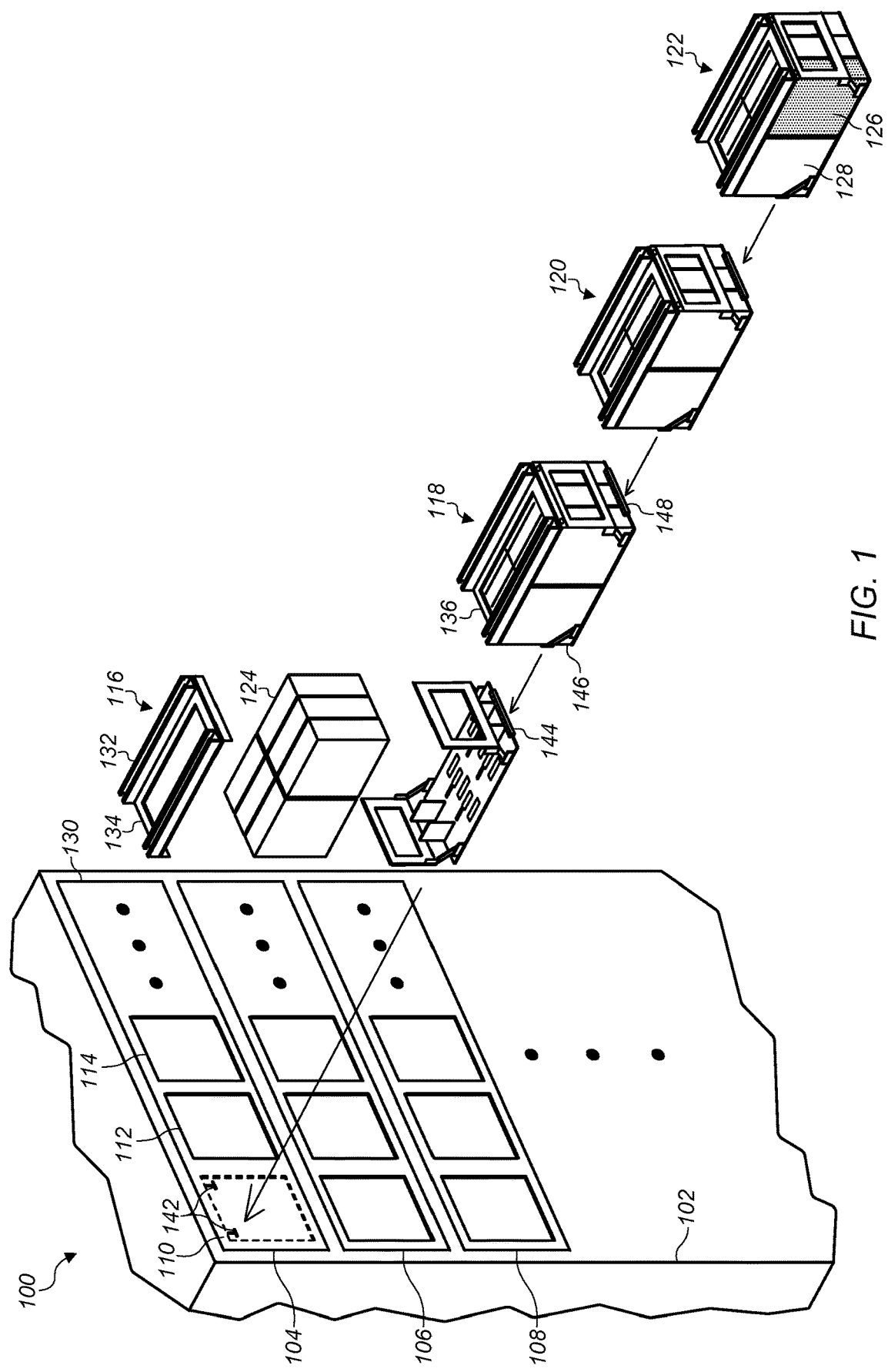
FIG. 1 is a perspective view illustrating a rack comprising multiple server systems and an exploded view of a server node of one of the server systems, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a system includes a rack and a server system mounted in the rack. The server system includes a server system chassis and multiple server system nodes mounted in the server system chassis. Each respective server system node of the server system includes multiple sub-node chassis and an array of devices, wherein segments of the array of devices are mounted in respective ones of the multiple sub-node chassis of the respective server node. Also, each of the respective server system nodes includes at least one server device mounted in at least one of the sub-node chassis of the respective server system node. Each sub-node chassis of each of the respective server system nodes is configured to be individually inserted into and removed from the server system chassis of the server system of which the server system node is a part. Also, each sub-node chassis includes an intra node connector configured to couple with an intra node connector of an adjacent sub-node chassis to allow communications to and from mass storage devices and server devices mounted in separate ones of the multiple sub-node chassis of the respective server node. For example, a server system may mount in one or more slots in a rack and include multiple server nodes, the server nodes of the server system may be broken up into segments mounted in separate sub-node chassis in order to facilitate installation and removal of the server nodes into the server system chassis mounted in the rack. Breaking up the server node into manageable segments may also enable the server node to be lifted by a single person and installed in the rack by a single person. Also, continuing the example, the segments of the server node may function as a single node when installed in the server system when the segments of the server node are coupled together via intra node connectors.

According to one embodiment, a device includes a server node configured to mount in a server system chassis. The server node includes multiple sub-node chassis and an array of devices, wherein segments of the array of devices of the server node are mounted in respective ones of the multiple sub-node chassis of the server node, wherein the array of devices includes mass storage devices. Each of the sub-node chassis are configured to be individually installed in the server system chassis. Also, each sub-node chassis includes an intra node connector configured to couple with an intra node connector of an adjacent sub-node to allow communications to or from devices mounted in separate ones of the multiple sub-node chassis of the server node.

According to one embodiment, a method includes installing a sub-node chassis in a server system chassis mounted in a rack, wherein the sub-node chassis comprises a portion of an array of mass storage devices of the server node; installing an additional sub-node chassis in the server system chassis mounted in the rack, wherein the additional sub-node chassis comprises an additional portion of the array of mass storage devices of the server node; and causing an intra node connector of the sub-node chassis to couple with a corresponding intra node connector of the additional sub-node chassis to allow node communications between the mass storage devices in the sub-node chassis.

As used herein, "backplane" means a plate or board to which other electronic components, such as mass storage devices, server devices, etc. can be mounted. In some embodiments, mass storage devices, which can include one or more hard disk drives, are plugged into a backplane in a generally perpendicular orientation relative to the face of the backplane. In some embodiments, a server device is plugged into a backplane in a generally perpendicular orientation relative to the face of the backplane. In some embodiments, a backplane includes one or more power buses that can transmit power to components on the backplane, and one or more data buses that can transmit data to and from components installed on the backplane. In some embodiments, components that collectively function as a server device may be separately mounted on a backplane.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, a "rack" means a rack, container, frame, or other element or combination of elements that can contain or physically support one or more computer systems. In some embodiments a rack is a standard 19" rack that conforms to electronic industries alliance (EIA) standards.

Some servers that mount in a rack may be general purpose servers, while some rack-mounted servers may be specially designed for storage capacity or compute capacity. Such specially designed servers may include storage servers that include several hard disk drives and controller servers that include controllers that manage storage operations directed at the hard disk drives in the storage servers. A controller server may be mounted in a separate chassis in a separate rack slot from a rack slot in which a storage server is mounted. In such servers, some available space in the slot of the rack in which the controller server is mounted may go unutilized, thus reducing the number and density of hard disk drives and compute capacity that can be mounted in the rack. For example, only a portion of a space of a rack slot in which a controller server is mounted may be occupied by components of the controller server or only a portion of an interior space within a chassis of a controller server may be occupied by components of the controller server. Also, some servers that include a separate controller server may be configured such that the controller server and hard disk drives controlled by the controller server form a single logical node. In such servers, if a common component fails, such as a component in the controller server, the whole logical node including all of the hard disk drives controlled by the controller server may become inaccessible. Thus in such designs a large number of hard disk drives may be rendered unavailable due to a single component failure.

In some embodiments, wasted space in a separate controller server may be eliminated by including a server device in a same chassis of a server system along with mass storage devices, such as hard disk drives, that are controlled by the server device. Also, failure impact due to a single component failure may be reduced by including several server nodes, that are each their own logical node and each with their own server device, in the same chassis of the server system. In some embodiments, a server system may include a server device mounted in a same chassis with mass storage devices, such as hard disk drives. In some embodiments, the server device may occupy an equivalent volume of space in the chassis as one of the mass storage devices. In some embodiments, the server device may be integrated into a backplane of the server node. Thus a greater density of mass storage devices per rack may be achieved by eliminating unutilized space of a separate controller server. Also, in some embodiments, multiple server nodes each comprising its own server device and an array of mass storage devices controlled by the server device may be included in a chassis of a server system. The multiple server nodes may be independent of each other, so that if a component in one server node fails, such as a server device of the server node, the other server nodes in the server system may not be affected by the failure and continue to be available to perform storage operations.

Furthermore, a server node of a server system may include an array of devices comprising mass storage devices and at least one server device, wherein segments of the array of devices are mounted in separate sub-node chassis that can be installed in the server system chassis separately. The sub-node chassis of a server node may be coupled together when installed in the server system chassis to form a logical node or server node of the server system. In some embodiments, a server system may include multiple such server nodes, wherein each server node comprises multiple sub-node chassis comprising mass storage devices and at least one server device that are coupled together to form a logical node or server node of the server system.

In some embodiments, a server system chassis may be a single chassis that is configured to mount in a rack and configured to mount multiple sets of sub-node chassis. For example, a server system chassis may occupy one or more slots in a rack. In some embodiments, a height of a server system may span multiple 1 U slots in a standard 19" EIA rack. For example, a server system may have a height of 1 U, 2 U, 3 U, 4 U, 5 U, 1.5 U, 2.5 U, etc.

FIG. 1 is a perspective view illustrating a rack comprising multiple server systems and an exploded view of a server node of one of the server systems, according to some embodiments.

System 100 includes rack 102 and server systems 104, 106, and 108 mounted in rack 102. Each of server systems 104, 106, and 108 include multiple server nodes. Each server node includes mass storage devices and at least one server device that together form a separate logical node of the server system. For example, server system 104 includes server nodes 110, 112, and 114, wherein each server node includes an array of mass storage devices and at least one server device for controlling storage operations directed at the array of mass storage devices and/or for performing compute operations.

In some embodiments, a server node of a server system may comprise multiple sub-node chassis coupled together via intra node connectors, wherein each sub-node chassis comprises a segment of an array of mass storage devices and server devices of the server node. FIG. 1 illustrates an exploded view of server node 110. Server node 110 includes sub-node chassis 116, 118, 120, and 122. Devices 124 are mounted in sub-node chassis 116, 118, 120, and 122. In some embodiments, devices 124 may be mass storage devices, such as hard disk drives. In some embodiments, devices 124 may be server devices. In some embodiments, devices 124 mounted in one of sub-node chassis 116, 118, 120, or 122 may include a combination of mass storage devices and server devices. For example device 126 mounted in sub-node chassis 122 is a server device 126 for server node 110, whereas the other ones of devices 124 mounted in sub-node chassis 122 are mass storage devices 128.

In some embodiments, components that function as a server device may be mounted on a backplane included in at least one sub-node chassis of a set of sub-node chassis that couple together to form a server node. In some embodiments, a server device may be a separate device that plugs into a connector on a backplane included in a sub-node chassis.

In some embodiments, a server device that is a separate device that plugs into a backplane, such as server device 126, may occupy up to an equivalent volume of space within sub-node chassis 122 as one of the mass storage devices mounted in sub-node chassis 122, such as one of mass storage devices 128. In some embodiments, a server device, such as server device 126, may have a form factor that is equivalent to a form factor of a mass storage device, such as one of mass storage devices 128. In some embodiments, a server device, such as server device 126, may have a form factor that is smaller than a form factor of a mass storage device, such as one of mass storage devices 128. For example, server device 126 may have a form factor such that server device 126 can fit within a space that has a volume equivalent to a volume of a mass storage device, such as one of mass storage devices 128.

A server device, such as server device 126, may include one or more network ports and be configured to communicate with systems outside of system 100. For example, server device 126 may be configured to receive read and write requests from other computing systems and/or servers to read data from and write data to mass storage devices 128 or other mass storage devices in any of sub-node chassis 116, 118, 120, or 122.

In some embodiments, a server node in a server system that forms its own logical node, such as one of server nodes 110, 112, or 114 in server system 104, may include more than one server device in the server node. For example, a server node, such as one of server nodes 110, 112, or 114, may include multiple server devices in the same array of devices that forms the server node. The multiple server devices of a server node may be configured to coordinate with each other to control storage operations related to mass storage devices of the server node, such as mass storage devices 124 and to perform compute operations. In some embodiments, a ratio of server devices to mass storage devices may be adjusted by adding or removing mass storage devices and/or server devices from sub-node chassis that forms the server node.

In some embodiments, multiple server devices may be included in a single server node to provide additional computing capacity for the server node.

In some embodiments, mass storage devices and/or a server device of a server node are configured to be removed from the server node while other server nodes of the server system are in operation. For example, segments of server node 110 in sub-node chassis 116, 118, 120 and 122 may be removed from server system 104 while server nodes 112 and 114 remain in operation.

In some embodiments, data storage operations for mass storage devices of a server node, such as one of server nodes 110, 112, or 114, may be controlled by a server device included in the server node without using an additional controller. For example, the mass storage devices of a server node may be controlled without an external controller controlling storage operations of the mass storage devices of the server node. For example each of server nodes 110, 112, or 114 may include their own server device and not rely on an external controller mounted in another rack slot in rack 102 to control data operations of mass storage devices in respective ones of server nodes 110, 112, or 114.

By including server devices in an array with mass storage devices in a single chassis, a high density of mass storage devices in a rack can be achieved. For example, in some embodiments, a 48 U standard 19" rack may include over a thousand 3.5" hard disk drives along with server devices for controlling the hard disk drives, wherein the hard disk drives are mounted in sub-node chassis included in multiple server systems mounted in the rack. In some embodiments, a 48 U standard 19" rack may include more or less hard disk drives mounted in sub-node chassis than illustrated in FIG. 1. In some embodiments, other rack sizes may be used.

Furthermore, a server node of a server system that includes mass storage devices and server devices mounted in sub-node chassis may be configured such that a single person can install respective sub-node chassis including devices such as mass storage devices and server devices mounted in the sub-node chassis of a server node. For example, some people may not be able to lift server nodes into a rack that weigh over a certain amount, for example more than 50 lbs. However, the same person may be able to lift segments of a server node that each weigh less than 50 lbs. For example, server node 110 is illustrated in FIG. 1 to include four segments each mounted in its own sub-node chassis, so that while a person may not be able to lift all the mass storage devices and server devices of server node 110 at one time, the same person may be able to lift sub-node chassis 116 including devices 124 mounted in sub-node chassis 116 into server system chassis 130, and then subsequently lift sub-node chassis 118 including devices 124 mounted in sub-node chassis 118, and repeat the same process for sub-node chassis 120 and 122.

In some embodiments, a sub-node chassis, such as any of sub-node chassis 116, 118, 120, or 122, may be configured to couple with a cover that includes rail guides configured to slide on rails of a server system chassis. For example, cover 134 includes rail guides 132 that are configured to slide on rails 142 of server system chassis 130. In some embodiments, each sub-node chassis of a server node may couple with a cover that includes rail guides that extend away from the cover by a different distance than rail guides of another cover of an adjacent sub-node chassis. For example, rail guides 132 of cover 134 may extend a distance from cover 134 that is greater than a distance from cover 136 that rail guides 132 of cover 136 extend. Each subsequent sub-node chassis cover of a server node may include rail guides that extend away from its respective cover by an incrementally shorter or longer distance. Thus, when installed on a common rail in a server system chassis, a set of sub-node chassis with respective covers may be positioned at different elevations in the server system chassis. In some embodiments, a set of sub-node chassis of a server node may be positioned in a stair step arrangement such that an air space above the set of sub-node chassis increases and an air space below the sub-node chassis decreases from one sub-node chassis to the next sub-node chassis when the set of sub-node chassis of the server node are installed on one or more rails of a server system chassis in the stair-step arrangement.

In some embodiments, a sub-node chassis may include an intra node connector coupled to the sub-node chassis that is configured to couple with an intra node connector of an adjacent sub-node chassis when the sub-node chassis and the adjacent sub-node chassis are installed in a server system chassis. For example, sub-node chassis 116 includes intra node connector 144 coupled to sub-node chassis 116. In some embodiments, a sub-node chassis may include multiple intra node connectors coupled to the sub-node chassis at different elevations. For example, sub-node chassis 118 includes intra node connector 146 at a same elevation as intra node connector 144 (hidden behind the sub-node chassis) of sub-node chassis 116 and also includes intra node connector 148 at a lower elevation on sub-node chassis 118 than intra node connector 146. A sub-node chassis that includes intra node connectors mounted at different elevations on the sub-node chassis may be configured to couple with sub-node chassis of a set of sub-node chassis that are arranged in a stair step arrangement such that a first adjacent sub-node chassis is at a higher elevation than the sub-node chassis and couples with the higher elevation intra node connector and another adjacent sub-node chassis on an other side of the sub-node chassis is at a lower elevation than the sub-node chassis and couples with the lower intra node connector. In some embodiments, an edge of a backplane may be configured to couple with a connector of an adjacent sub-node chassis as an intra node connector.

In some embodiments, an array of devices of a server node may be broken into segments, where each segment is mounted in a sub-node chassis in a variety of other configurations. For example, a segment may include more or less devices of a server node. Also, in some embodiments, segments of a server node may be mounted in sub-node chassis that couple together on other sides of the sub-node chassis than as illustrated in FIG. 1.

In some embodiments, a server system chassis, such as server system chassis 130, may include multiple sets of rails for mounting multiple sets of sub-node chassis of multiple server nodes in the server system chassis.

Figure 2:
FIG. 2 is a front view of a server system chassis, according to some embodiments.

FIG. 2 is a front view of a server system chassis, according to some embodiments. System 200 illustrated in FIG. 2 may be a top portion of system 100 illustrated in FIG. 1 and server system chassis 130 as illustrated in FIG. 1 may be a server system chassis 202 as illustrated in FIG. 2. System 200 includes rack 204 and server system chassis 202 mounted on shelf 206 of rack 204. In some embodiments, a server system chassis may be mounted in a rack via other suitable means, such as side rails, without using a shelf, such as shelf 206. Server system chassis 202 includes rails 208 for mounting sub-node chassis of a first sever node in server system chassis 202, rails 210 for mounting sub-node chassis of an additional server node in server system chassis 202, and rails 212 for mounting sub-node chassis of another server node in server system chassis 202. In some embodiments, a server system chassis may include any number of rails for mounting any number of server nodes in a server system chassis. In some embodiments, a single rail may be configured for mounting a sub-node chassis of a server node in a server system chassis. In some embodiments, other suitable rail designs may be used in addition to the rail designs illustrated in FIG. 2.

In some embodiments, a server system or rack may include one or more air moving devices, such as fans that cause air to flow over devices mounted in a server system.

Figure 3:
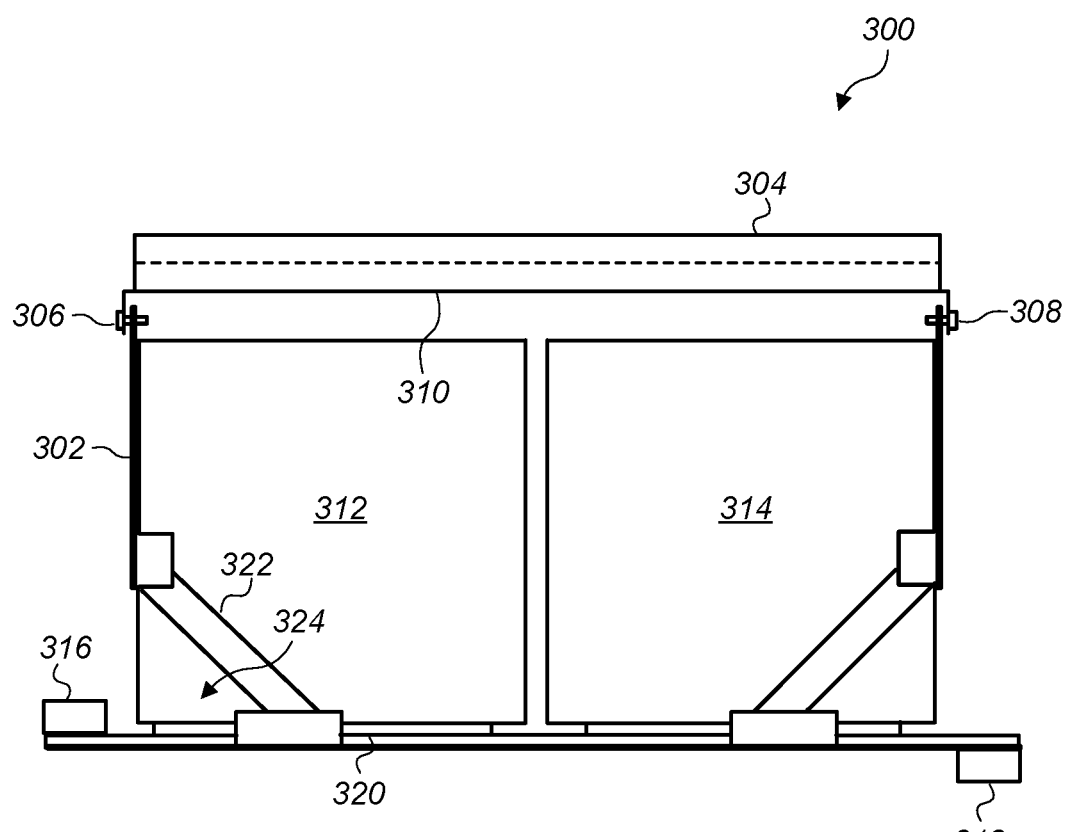
FIG. 3 is a side view of a sub-node chassis with devices mounted in the chassis, according to some embodiments.

FIG. 3 is a side view of a sub-node chassis with devices mounted in the chassis, according to some embodiments. Segment 300 may be any of the segments of server nodes 110, 112, 114, such as any of sub-node chassis 116, 118, 120, or 122 illustrated in FIG. 1. Segment 300 includes sub-node chassis 302 and cover 304 coupled to sub-node chassis 302 via pins 306 and 308. In some embodiments, other suitable mechanisms may be used to couple a cover to a sub-node chassis, such as screws, latches, clasps, etc. Cover 304 includes rail guides 310. In some embodiments, rail guides may run along a length of a cover, such as rail guides 310 illustrated in FIG. 3. In some embodiments, a rail guide may only run along a portion of a cover. For example, in some embodiments portions of rail guides 310 may be mounted on corners of cover 304 and a center portion above cover 304 may not include rail guides. In some embodiments, rail guides, such as rail guides 304 may include ventilation holes in the rail guides to allow air to flow around and through the rail guides.

Sub-node chassis 302 includes devices 312 and 314 mounted in sub-node chassis 302. In some embodiments, devices 312 and 314 may be mass storage devices, server devices, or some combination of mass storage devices and server devices. Sub-node chassis 302 also includes intra node connector 316 that is mounted at a higher elevation on sub-node chassis 302 than intra node connector 318 which is mounted at a lower elevation on sub-node chassis 318. In addition, sub-node chassis 302 includes backplane 320 mounted on a bottom side of sub-node chassis 302. In some embodiments an intra node connector, such as intra node connector 316, may be mounted on a top side of a backplane, such as backplane 320, and another intra node connector, such as intra node connector 218, may be mounted on a bottom side of a backplane, such as a bottom side of backplane 320. In some embodiments, an intra node connector may be an edge of a backplane that is configured to couple into an intra node connector included in an adjacent sub-node chassis. For example, intra-node connector 316 or intra-node connector 318 may be an edge of backplane 320 that is configured to couple with an intra node connector of an adjacent sub-node chassis.

In some embodiments, a sub-node chassis may include open corners that allow a bottom side of devices mounted in the chassis to be accessed via the open corner. For example, in order to remove device 312 from sub-node chassis 302, a person may apply a force to bottom side of device 312 which is accessible via open corner 324. In some embodiments, mass storage devices or server devices such as devices 312 and 314 may be coupled to backplane 320 via connectors, and applying a force to a bottom side of one of devices 312 or 314 may cause the device to disconnect from the connector of the backplane. In some embodiments, a sub-node chassis may include angled support members, such as angled support member 322, that provide rigidity to the sub-node chassis and also allows access to devices, such as devices 312 and 314, via open corners, such as open corner 324.

In some embodiments, a backplane mounted in a sub-node chassis may include openings that permit air to flow through the backplane and across devices mounted in the sub-node chassis.

Figure 4:
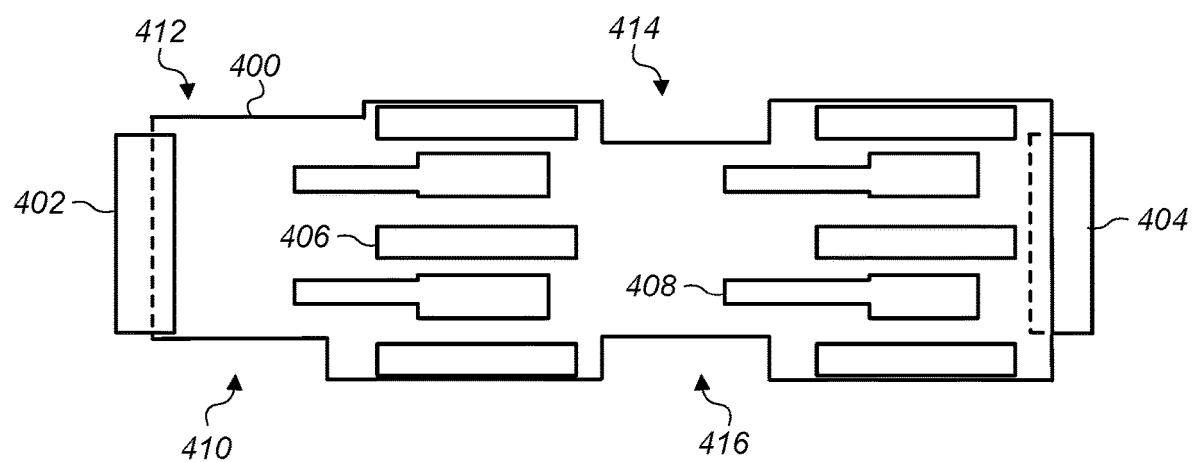
FIG. 4 is a top view of a sub-node backplane, according to some embodiments.

FIG. 4 is a top view of a sub-node backplane, according to some embodiments. Backplane 400 illustrated in FIG. 4 may be a backplane included in any of the sub-node chassis described in FIGS. 1-3 and FIGS. 5-11. Backplane 400 includes intra node connector 402 mounted on a top side of backplane 400 and intra node connector 404 mounted on a bottom side of backplane 400. Device connectors 406 are mounted in two rows of three each and are configured to couple mass storage devices and server devices to backplane 400. In some embodiments, a backplane, such as backplane 400, may include more or less device connectors, and the device connectors may be arranged in several different arrangements, such as more or less columns and more or less rows. In some embodiments, an intra node connector, such as intra node connector 402 or intra node connector 404, may be an edge of a backplane, such as an edge of backplane 400, that includes contacts configured to couple with an intra node connector of an adjacent sub-node chassis to allow communications and/or power to flow between components of the adjacent sub-node chassis when coupled together.

In some embodiments, a sub-node backplane, such as backplane 400 may include openings, such as openings 408, configured to allow air to flow through the backplane and across devices coupled to the backplane. For example, backplane 400 includes respective ones of openings 408 between respective device connectors 406.

In some embodiments, a sub-node backplane may be configured with open corners to allow access to remove devices mounted on the backplane via the open corners. For example, backplane 400 includes open corners 410, 412, 414, and 416. In some embodiments, a sub-node backplane, such as backplane 400 may be recessed at locations on the backplane that correspond with corners of devices, when the devices are mounted on the backplane. This may allow the devices to be easily removed from the backplane by accessing a bottom side of the device at the open corner. For example, backplane 400 is recessed at open corners 410, 412, 414, and 416.

In some embodiments, multiple sub-node chassis of a server node may be positioned in a server system chassis to form a cold air plenum and a hot air plenum. The cold air plenum may receive air from a cold aisle and air that has passed over devices mounted in the sub-node chassis of the server node may flow into a hot air plenum that exhausts hot air into a hot aisle. A server system chassis, rack, or structure coupled to a rack or server system chassis may include one or more air moving devices, such as fans that cause air to flow through a server system chassis. In some embodiments, multiple sub-node chassis of a server node may be arranged in a server system chassis such that a cross sectional area of a cold plenum decreases from sub-node to sub-node across the server node and such that a cross sectional area of a hot plenum increases from sub-node to sub-node across the server node.

Figure 5:
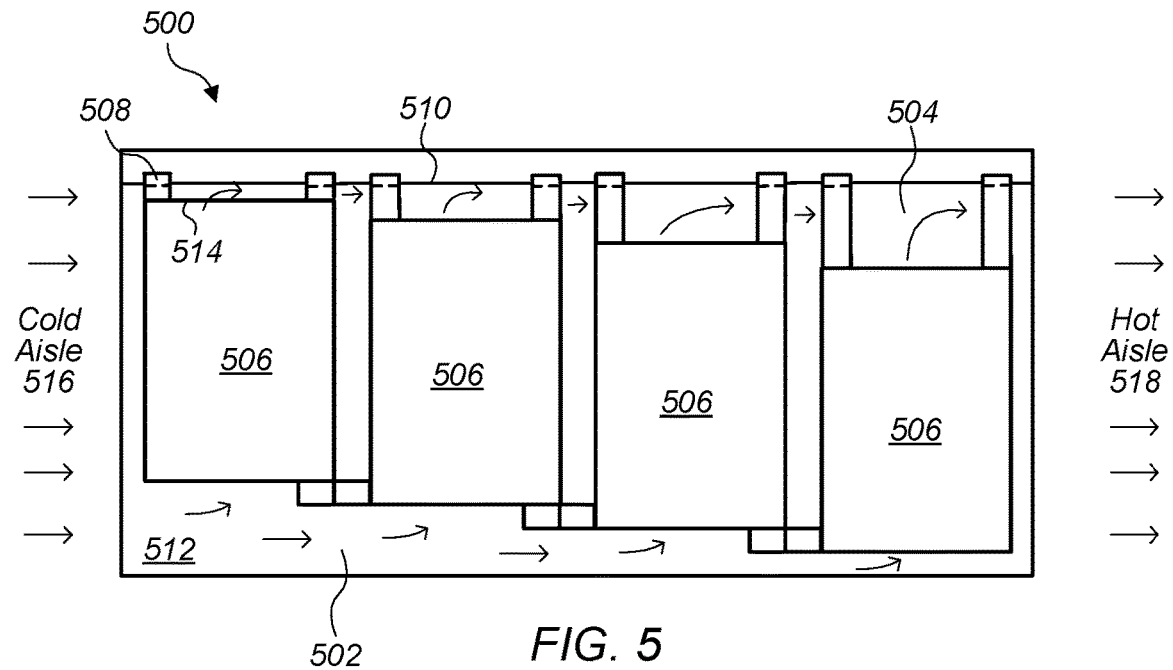
FIG. 5 is a side view of a cutaway of a server system chassis illustrating multiple sub-node chassis coupled together and mounted in the server system chassis, according to some embodiments.

FIG. 5 is a side view of a cutaway of a server system chassis illustrating multiple sub-node chassis coupled together and mounted in the server system chassis, according to some embodiments. Server system 500 includes cold plenum 502 below multiple sub-node chassis 506 of a server node and hot plenum above multiple sub-node chassis 506 of a server node. Rail guides 508 of covers 514 of sub-node chassis 506 couple with rail 510 of server system chassis 512. Each rail guide 508 of covers 514 coupled with sub-node chassis 506 extends away a particular distance from respective ones of covers 514. In some embodiments, rail guides of covers for adjacent sub-node chassis of a server node may extend away from the covers of the respective sub-node chasses by incrementally increasing or decreasing distances. For example, rail guides 508 extend away from covers 514 by incrementally greater distances for each respective sub-node chassis 506. This causes cold air plenum 502 to reduce in cross-sectional area and hot air plenum 504 to increase in cross-section area. Air that is pulled into server system chassis 512 from cold aisle 516 enters cold air plenum 502 and as cold air plenum 502 reduces in cross sectional area, a portion of the air in cold air plenum 502 flows through openings in backplanes included in respective ones of the multiple sub-node chassis 506 and passes across devices such as mass storage devices and server devices mounted in respective ones of sub-node chassis 506. Heated air that has removed waste heat from devices mounted in respective ones of sub-node chassis 506 then flows into hot air plenum 504 and is exhausted out of server system chassis 512 and into hot aisle 518.

In some embodiments, other arrangements may be used to position sub-node chassis in a server system chassis such that the multiple sub-node chassis of a server node form a cold air plenum and a hot air plenum above or below the sub-node chassis. Also, other arrangements may be used to cause elevations of sub-node chassis to change across a server node. For example, in some embodiments, a sub-node chassis may include legs and feet that position the sub-node chassis at different elevations in a server system chassis.

Figure 6:
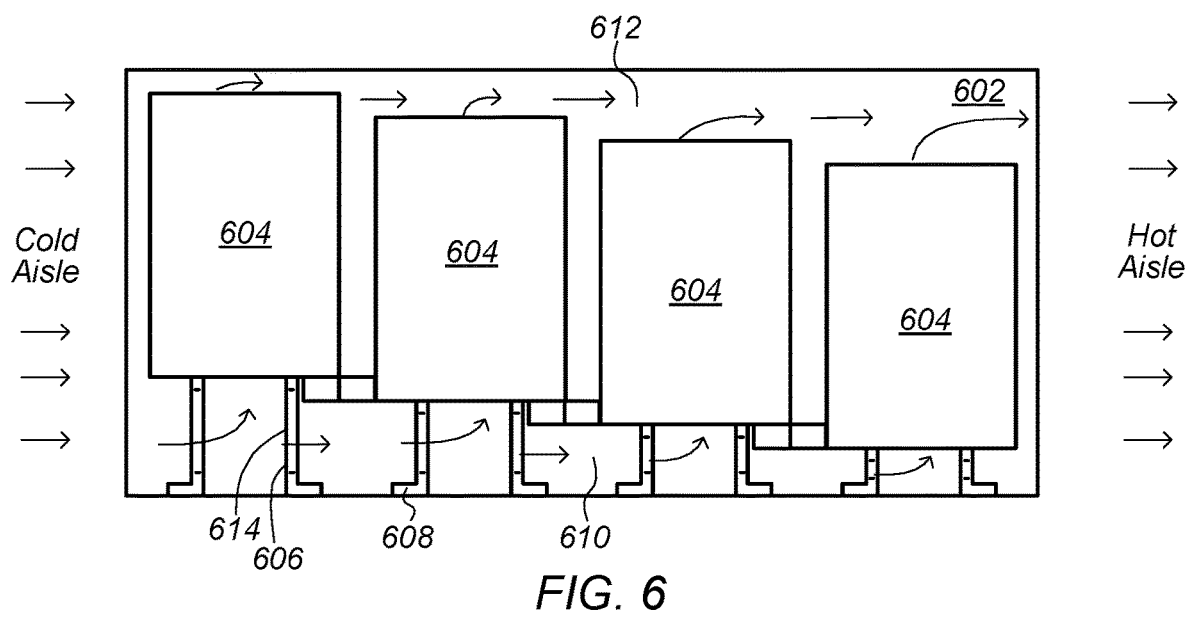
FIG. 6 is a side view of a cutaway of a server system chassis illustrating multiple sub-node chassis coupled together and mounted in the server system chassis, according to some embodiments.

FIG. 6 is a side view of a cutaway of a server system chassis illustrating multiple sub-node chassis coupled together and mounted in the server system chassis, according to some embodiments. For example, server system chassis 602 includes multiple sub-node chassis 604 that each include legs 606 and feet 608. In some embodiments, respective sub-node chassis of a server node may have respectively shorter legs, such that the sub-node chassis when installed in a server system chassis form a cold plenum with a reducing cross sectional area and a hot plenum with an increasing cross sectional area. For example, server system chassis 602 includes cold air plenum 610 below multiple sub-node chassis 604 and hot air plenum 612 above multiple sub-node chassis 604. In some embodiments, legs of a sub-node chassis may include openings, such as openings 614 that allow air to flow through the legs of the sub-node chassis.

Figure 7:
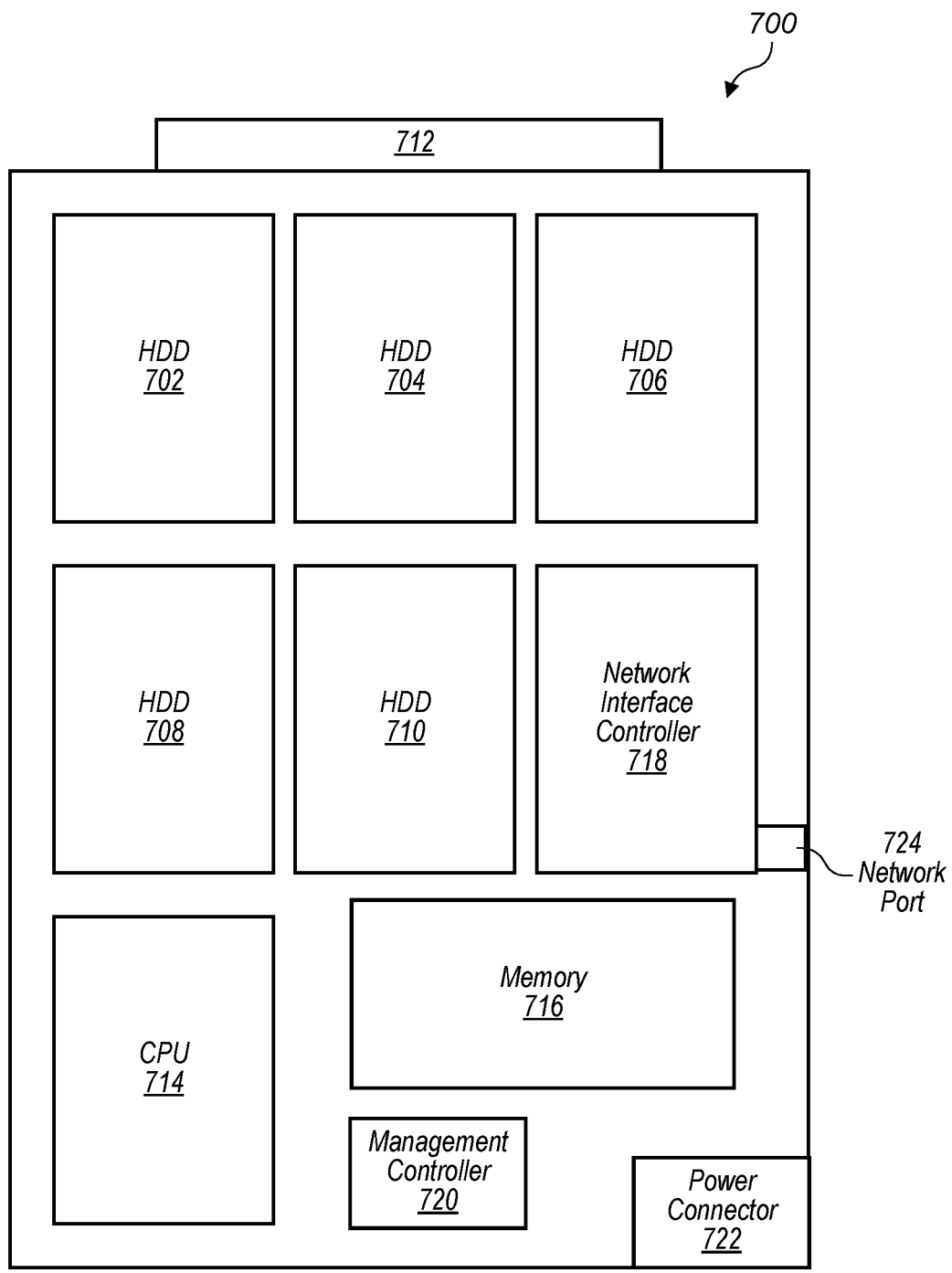
FIG. 7 is a schematic top down view of a sub-node chassis that includes mass storage devices and a server device integrated into a sub-node backplane, according to some embodiments.

In some embodiments, a server device may be integrated into a backplane of at least on sub-node chassis of a server system, as described below in regard to FIG. 7. In some embodiments, a server device may be a separate device that couples with a backplane, as described in more detail below in regard to FIG. 8. FIG. 7 is a schematic top down view of a sub-node chassis that includes mass storage devices and a server device integrated into a sub-node backplane, according to some embodiments.

Sub-node backplane 700 includes mass storage devices 702, 704, 706, 708, and 710 coupled to sub-node backplane 700 via device connectors, similar to the device connectors described in regard to FIG. 4. Sub-node backplane 700 also include an intra node connector 712 mounted on a bottom side of the sub-node backplane. In some embodiments, an intra node connector could be mounted on a top side of sub-node backplane 700. Sub-node backplane 700 also includes processor 714, memory 716, network interface card 718, management and control circuit 720, power connector 722, and network port 724 coupled to sub-node backplane 700. Processor 714 comprises a processor and interface for communicating with mass storage devices via sub-node backplane 700. Processor 714 also comprises a communication interface with memory 716, mass storage devices 702, 704, 706, 708, 710, and intra node connector 712. In some embodiments processor 714 may be a system on a chip (SoC), a general purpose processor, an application specific integrated circuit (ASIC), or another device that provides processing capability and communicates with via sub-node backplane 700 and intra node connector 712. In some embodiments, management and control circuit 720 manages conditions of a server node of which sub-node backplane 700 is a part such as temperature conditions. In some embodiments, management and control circuit 720 includes an interface for connecting with an external heath monitoring system, such as an intelligent platform management interface (IPMI). In some embodiments, memory 716 are RAM devices such as double data rate fourth generation synchronous dynamic random-access memory (DDR4) or other suitable RAM devices. In some embodiments, network port 724 is a small form factor pluggable 10 gigabit port or other suitable port for network connection. In some embodiments, power connector 722 may be configured to receive electrical power via a cable connection. In some embodiments, sub-node backplane 700 may include a boot drive that stores program instructions for booting a server node of which sub-node backplane 700 is a part. In some embodiments, boot instructions may be stored in a remote location. In some embodiments connectors that couple devices such as devices 702, 704, 706, 708, and 710 to sub-node backplane 700 may be mini SAS HD connectors. In some embodiments, communication via connectors may be in accordance with a FibreChannel standard, Serial ATA standard, or other suitable standard. In some embodiments, a backplane may couple with connectors to directly couple server devices with mass storage devices via a backplane without using expanders or host bus adapters.

Figure 8:
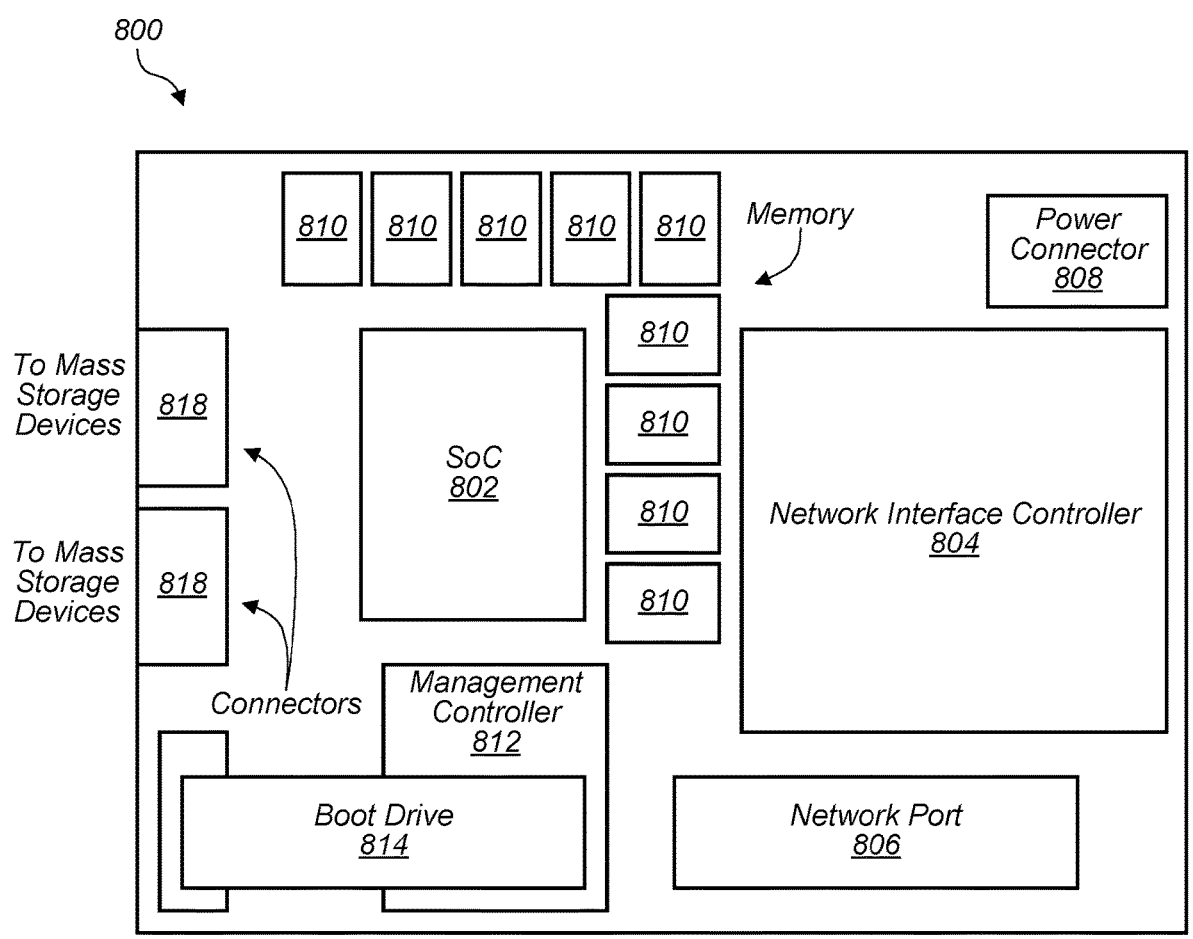
FIG. 8 is a schematic illustration of a server device configured to couple with a sub-node backplane that occupies up to an equivalent volume of space as a mass storage device, according to some embodiments.

FIG. 8 illustrates a server device that is separate from a backplane and that occupies up to an equivalent volume of space in a sub-node chassis as a mass storage device, according to some embodiments. Server device 800 illustrated in FIG. 8 may be any of the server devices described in FIGS. 1-7 and 9-10. In some embodiments, server device 800 may have a form factor that occupies up to an equivalent volume of space as a mass storage device, such as a 3.5" hard disk drive.

Server device 800 includes system on a chip 802, memory devices 810, power connector 808, network interface controller 804, network port 806, management and control circuit 812, boot drive 814, and connectors 816 and 818. System on a chip 802 comprises a processor and interface for communicating with mass storage devices via connectors 816 and 818. System on a chip 802 also comprises a communication interface with memory 810. In some embodiments system on a chip 802 may be an SoC, a general purpose processor, an application specific integrated circuit (ASIC), or another device that provides processing capability and communicates with connectors 816 and 818. In some embodiments, management and control circuit 812 manages conditions of server device 800 such as temperature conditions. In some embodiments, management and control circuit 812 includes an interface for connecting with an external heath monitoring system, such as an intelligent platform management interface (IPMI). In some embodiments, memory devices 810 are RAM devices such as double data rate fourth generation synchronous dynamic random-access memory (DDR4) or other suitable RAM devices. In some embodiments, network port 806 is a small form factor pluggable 10 gigabit port or other suitable port for network connection. In some embodiments, power connector 808 may be configured to receive electrical power via a cable connection, and in some embodiments, power connector 808 may be configured to couple with a backplane and receive electrical power via the backplane. In some embodiments, boot drive 814 is a solid state drive that stores program instructions for booting server device 800. In some embodiments, boot instructions for server device 800 may be stored in a remote location and boot drive 814 may be omitted. In some embodiments connectors 816 and 818 are mini SAS HD connectors. In some embodiments, other suitable connectors may be used for connectors 816 and 818. In some embodiments, communication via connectors 816 and 818 may be in accordance with a FibreChannel standard, Serial ATA standard, or other suitable standard. In some embodiments, a backplane may couple with connectors 816 and 818 to directly couple server device 800 with mass storage devices via a backplane without using expanders or host bus adapters to connect server device 800 to mass storage devices.

In some embodiments, a server device, such as server device 800 may be mounted in a sub-node chassis via connectors 816 and 818 oriented down towards a bottom of a slot in the sub-node chassis and coupled with a backplane that runs beneath mass storage devices mounted in the sub-node chassis and the server device mounted in the sub-node chassis. In some embodiments, a server device, such as server device 800 may be coupled to backplanes via cables connected to connectors 816 and 818.

In some embodiments, a server device such as server device 800 may be integrated into a backplane as discussed in regard to FIG. 7. For example the respective components of server device 800 described above may be mounted on a circuit board of a backplane.

In some embodiments, a server device, such as server device 800, may have a form factor that is equivalent to a form factor of a standard 3.5" hard disk drive. In some embodiments a server device, such as server device 800, may have a different form factor.

In some embodiments, an array of devices of a server node may be segmented into segments that run from front to back of a server system chassis. Each segment may include a sub-node chassis that extends from a front of a server system to a back of a server system when installed in a server system chassis of the server system. In some embodiments, a sub-node chassis of a server node may include intra node connectors mounted on a side of the sub-node chassis that are configured to couple with a corresponding intra node connector on a side of an adjacent sub-node chassis. In some embodiments, a sub-node chassis may include multiple backplanes that are mounted in the sub-node chassis at different elevations, so that when the sub-node chassis is installed in a server system, the multiple backplanes and devices, such as mass storage devices and server devices, mounted on the multiple backplanes are at different elevations in a server system chassis when the sub-node chassis is installed in the server system chassis.

For example, FIGS. 9A, 9B, and 9C illustrate embodiments of sub-node chassis that include backplanes at different elevations within the sub-node chassis. In some embodiments, a sub-node chassis, such as those illustrated in FIGS. 9A-C may run front to back when installed in a server system chassis.

Segment 900 includes sub-node chassis 902 and devices 904 mounted in sub-node chassis 902. Devices 902 may include mass storage devices and one or more server devices. Backplanes are positioned at different elevations within sub-node chassis 902 and are coupled together via connectors 908. Cover 910 is coupled to sub-node chassis 902 and includes rail guides configured to slide on rails of a server system chassis. In some embodiments, a sub-node chassis, such as sub-node chassis 902, may include legs as described in regard to FIG. 6 and may include open corners as described in FIGS. 3-4. In addition, a sub-node chassis, such as sub-node chassis 902 may form a cold air plenum and a hot air plenum when installed in a server system chassis in a similar manner as described in FIGS. 5 and 6.

FIG. 9B illustrates a front view of multiple sub-node chassis coupled together via intra node connectors, according to some embodiments. Any of sub-node chassis 912 illustrated in FIG. 9B may be a sub-node chassis 902 as illustrated in FIG. 9A. Each sub-node chassis 902 includes rail guides 914 and are configured to be individually mounted in a server system chassis and subsequently coupled together to form a server node of the server system. For example, intra node connectors 916 between adjacent ones of sub-node chassis 912 may couple together to allow communications between devices mounted in different ones of sub-node chassis 912. In some embodiments a server node comprising multiple sub-node chassis, such as multiple ones of sub-node chassis 912, may include a single server device or may include multiple server devices in one or more of the sub-node chassis coupled together to form the server node.

In some embodiments, a sub-node chassis such as sub-node chassis 902 illustrated in FIG. 9A may include a bottom surface 918 as illustrated in FIG. 9C and may include an air plenum, such as air plenum 920, within the sub-node chassis between the bottom surface, such as bottom surface 918, and the backplanes, such as backplanes 906. In some embodiments, cover 910 and/or rail guides may be omitted. For example, a sub-node chassis may have a tub configuration that slides on a server system chassis via a bottom surface of the sub-node chassis and may include devices mounted in the chassis at different elevations above the bottom surface of the of the sub-node chassis wherein a space between the bottom surface of the sub-node chassis and the different backplanes mounted within the sub-node chassis forms a cold air plenum or a hot-air plenum without being supported in a server system chassis by rail guides or legs.

Figure 10:
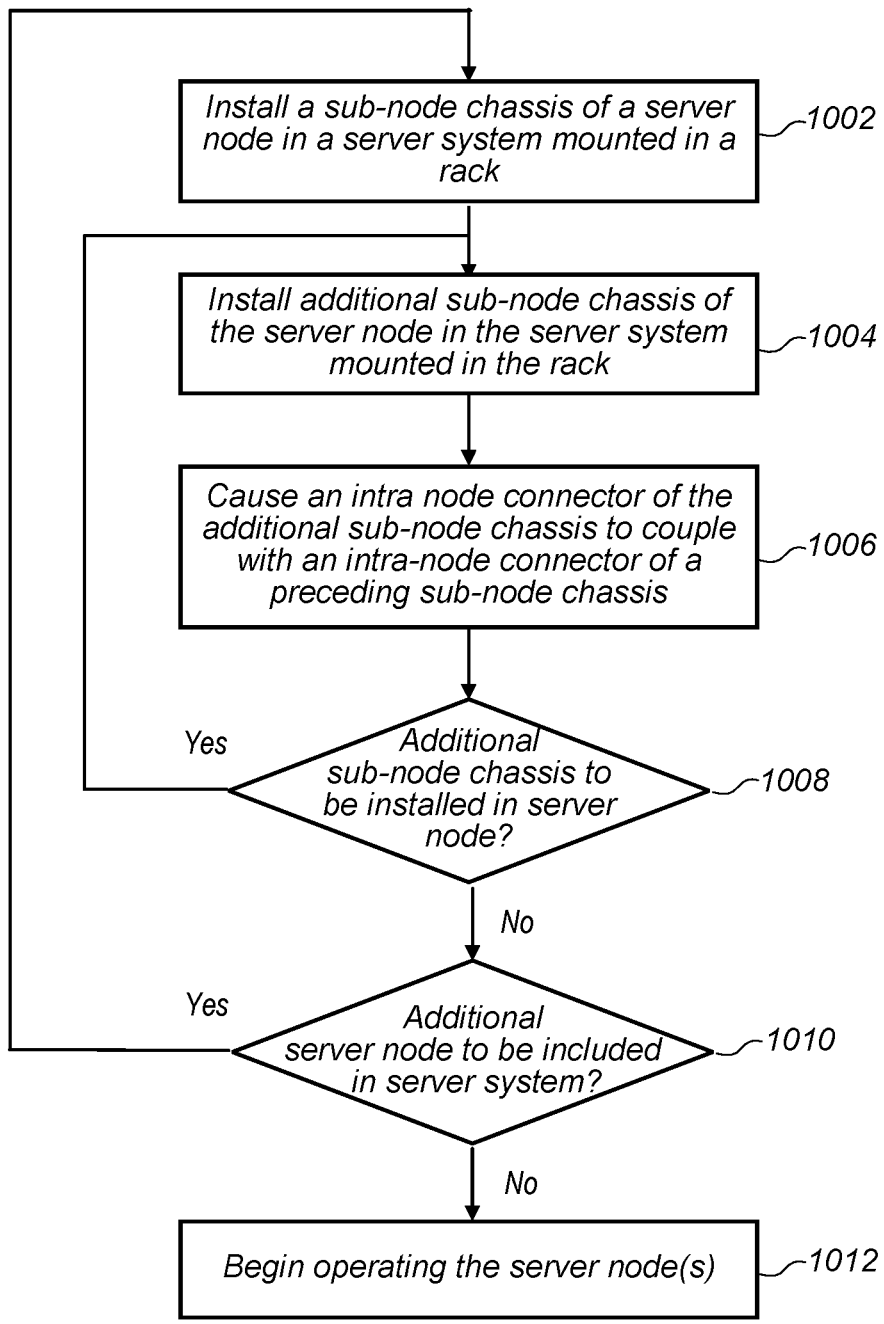
FIG. 10 illustrates a method of installing a sub-node chassis in a server system chassis mounted in a rack, according to some embodiments.

FIG. 10 illustrates a method of installing a sub-node chassis in a server system chassis mounted in a rack, according to some embodiments. At 1002, a sub-node chassis of a server node is installed in a server system chassis. In some embodiments, a sub-node chassis may include a cover coupled to the sub-node chassis wherein the cover includes rail guides. The rail guides may be configured to slide on one or more rails mounted in a server system chassis. In some embodiments, a server system chassis may include a separate set of one or more rails for each server node that is to be mounted in the server system chassis. A sub-node chassis may be any of the sub-node chassis described in FIGS. 1-9.

At 1004, an additional sub-node chassis of the server node is installed in the server system chassis. In some embodiments, the additional sub-node chassis may be installed on a same rail as the sub-node chassis installed at 1002. The additional sub-node chassis may include a cover coupled to the sub-node chassis that includes rail guides configured to slide on one or more rails mounted in the server system chassis. In some embodiments, the rail guides of the cover coupled to the additional sub-node chassis may extend away from the sub-node chassis a greater or smaller distance than the rail guides of the cover coupled to the sub-node chassis installed at 1002. In this way, the additional sub-node chassis installed at 1004 may be positioned at a higher or lower elevation in the server system chassis than the sub-node chassis installed at 1002. Additionally subsequent sub-node chassis installed in the server system chassis may be coupled with covers that include rail guides that extend away from the respective covers by incrementally greater or smaller distances. Thus, when multiple sub-node chassis are installed in a server system chassis via a common rail each sub-node chassis may be position at a slightly higher or lower elevation than a sub-node chassis adjacent to the sub-node chassis. In some embodiments, multiple sub-node chassis of a server node may be arranged in a stair step arrangement such that a volume of space above the multiple sub-node chassis increases or decreases along a depth of the server system chassis and a volume of space below the multiple sub-node chassis increases or decreases a corresponding amount along the depth of the server system chassis.

At 1006, an intra node connector of the additional sub-node chassis is caused to couple with an intra-node connector of a sub-node chassis that was previously installed in the server system chassis. In some embodiments, intra node connectors may be blind mate connectors, so that as one sub-node chassis is slid along a rail of a server system chassis an intra node connector of the sub-node chassis engages with a corresponding intra node connector of an adjacent sub-node chassis installed on the rail. In some embodiments, sliding a sub-node chassis into a server system chassis without a rail or rail guides may cause an intra node connector of the sub-node chassis to engage with and couple with an intra node connector of an adjacent sub-node chassis mounted in the server system chassis. In some embodiments, 1004 may be omitted between installing each sub-node chassis and may be performed after all or multiple sub-node chassis are installed in a server system chassis. For example, in some embodiments multiple sub-node chassis may be installed in a server system chassis and when a last sub-node chassis is installed in the server system chassis, a force may be applied to the last sub-node chassis to cause multiple intra node connectors of the multiple sub-node chassis installed in the server system chassis for the server node to couple together. In some embodiments, a server system chassis may include power and/or network connectors that are blind mate connectors, and at least one sub-node chassis may include corresponding power and/or network blind mate connectors. In such embodiments, a force may be applied to a group of sub-node chassis installed in a server system chassis to cause the blind mate power and/or network connectors of the at least one sub-node chassis to couple with blind mate power and/or network connectors of the server system chassis.

At 1008, it is determined if there are additional sub-node chassis to be installed for the server node. In response to determining there are additional sub-node chassis to be installed for the server node, the process reverts to 1004 and the next additional sub-node chassis is installed. If there are not additional sub-node chassis to be installed for the server node, at 1010 it is determined if additional server nodes are to be installed in the server system chassis. In response to determining additional server nodes are to be installed in the server system chassis, the process reverts to 1002 and the first sub-node chassis of the next server node is installed in the server system chassis.

In response to determining at 1010 that there are not additional server nodes to be installed in the server system chassis, at 1012 the server system that includes the server nodes comprising sub-node chassis coupled together via intra node connectors is put into operation.

Figure 11:
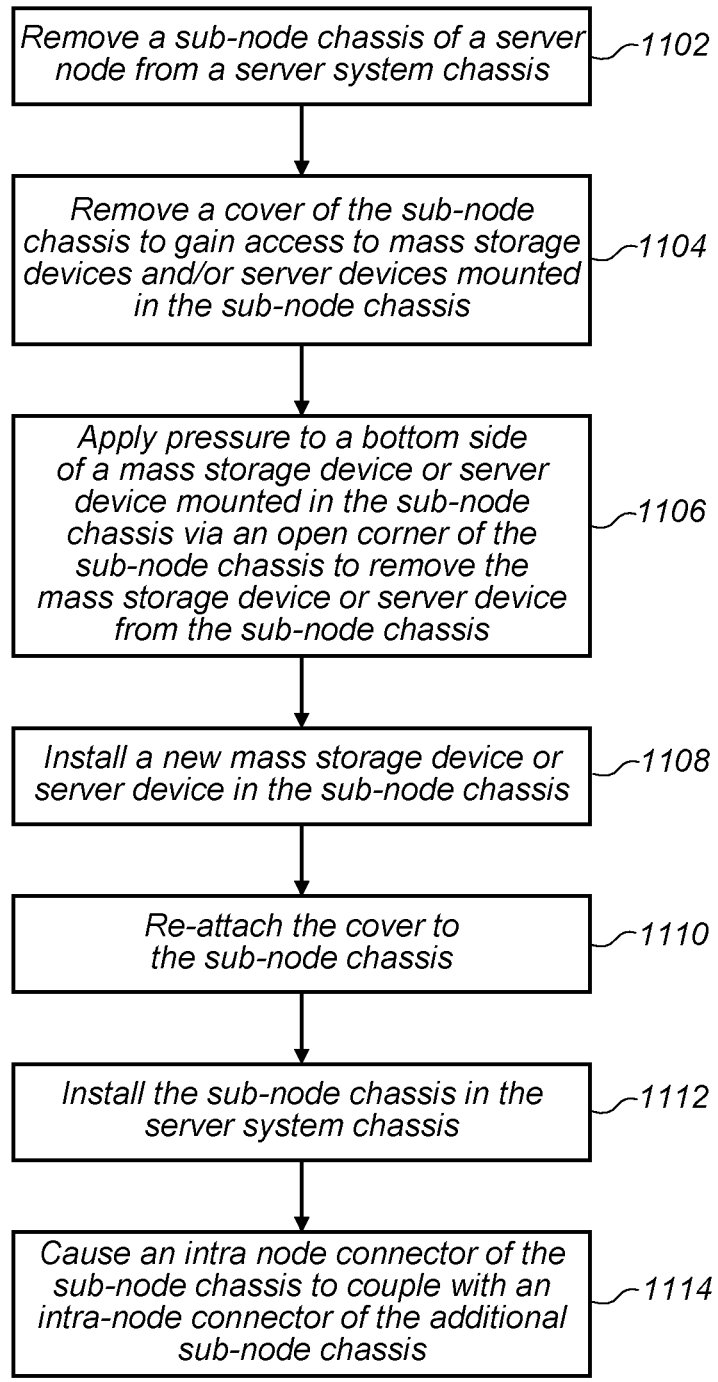
FIG. 11 illustrates a method of replacing a device mounted in a sub-node chassis installed in a server system chassis, according to some embodiments.

FIG. 11 illustrates a method of replacing a device mounted in a sub-node chassis installed in a server system chassis, according to some embodiments. At 1102 a sub-node chassis of a server node is removed from a server system chassis. A server node may include multiple sub-node chassis mounted in a server system chassis, so that in some circumstances when a device in a sub-node chassis that is mounted in the server system chassis behind one or more other sub-node chassis is to be replaced, multiple sub-node chassis may be removed from the server system chassis to reach the sub-node chassis that includes the device that is to be replaced. In some embodiments, a device may be removed, inspected and re-installed in a sub-node chassis without replacing the device in accordance with the method of FIG. 11. In some embodiments, each sub-node chassis including mass storage devices and server devices mounted in the sub-node chassis may weigh less than 50 pounds. In some embodiments, a sub-node chassis may be configured such that a single person can safely lift the sub-node chassis into a server system chassis mounted in a rack without help or risk of injury and remove the sub-node chassis from a server system chassis mounted in the rack without help or risk of injury.

At 1104 a cover of the sub-node chassis is removed from the sub-node chassis to gain access to mass storage devices and/or server devices mounted in the sub-node chassis. In some embodiments, a cover of a sub-node chassis may be coupled to the sub-node chassis via a screw, pin, latch, or other suitable securing mechanism. In some embodiments, removing the cover from the sub-node chassis may include disengaging a securing mechanism, such as a screw, pin, latch, etc.

After the cover is removed from the sub-node chassis, at 1106, pressure may applied to a bottom side of a mass storage device or a server device mounted in the sub-node chassis to remove the mass storage device or server device from the sub-node chassis. In some embodiments a sub-node chassis may include one or more open corners through which the corners and a portion of the bottom surface of the mass storage devices and/or server devices are accessible. Pressure may be applied to the mass storage devices and/or server devices via the open corners from an outside side of the sub-node chassis.

At 1108, a new mass storage device or server device is installed in the sub-node chassis. In some embodiments, the same mass storage device or server device may be re-installed in the sub-node chassis. In some embodiments, a mass storage device may be replaced with a server device, or a server device may be replaced with a mass storage device in order to alter storage capabilities or compute capabilities of the server node.

At 1110, the cover is re-attached to the sub-node chassis. A cover may be re-attached or re-coupled to a server node chassis by re-engaging a securing mechanism such as a screw, pin, fastener, etc.

At 1112, the sub-node chassis is reinstalled in the server system chassis. In some embodiments, re-installing the sub-node chassis in the server system chassis may include sliding rail guides of a cover coupled to the sub-node chassis onto rails mounted on the server system chassis. In some embodiments, a sub-node chassis may include legs and feet that slide on a bottom surface of a server system chassis without using rails and rail guides. In some embodiments a sub-node chassis may be supported in a server system chassis via other suitable structures.

At 1114, an intra-node connector coupled to the sub-node chassis is caused to couple with an intra-node connector of an adjacent sub-node chassis. In some embodiments, an intra node connector may be a blind mate connector such that sliding a sub-node chassis into position and applying a threshold amount of force to the sub-node chassis causes the intra node connector of the sub-node chassis to couple with an intra node connector of an adjacent sub-node chassis. In some circumstances in which multiple sub-node chassis were removed to reach the mass storage device or server device that was to be replaced, 1112 and 1114 may be repeated for each sub-node chassis that was removed from the server system chassis.

In some embodiments, mass storage devices in a server system are standard, off-the-shelf hard disk drives. Examples of suitable hard disk drive form factors may include 3.5", 5.25", and 2.5". In one embodiment, a standard 3.5" hard disk drive is installed in a sub-node chassis of a server node with other standard 3.5" hard disk drives. In some embodiments, a server device installed in a sub-node chassis may have a form factor equivalent to a 2.5", 3", 3.5", or 5.25" hard disk drive.

Although in the embodiments described above, some of the server systems have been described as being 3 U, 4 U, or 5 U in height, server systems may in various embodiments be 2 U, 4 U, 5 U, 6 U or any other height or dimensions.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A device, comprising:
   a server node configured to mount in a server system chassis, wherein the server node comprises:
   a plurality of sub-node chassis; and
   a plurality of backplanes, wherein respective backplanes of the plurality of backplanes are mounted in respective sub-node chassis of the plurality of sub-node chassis,
   wherein the server system chassis is configured to mount in a rack;
   wherein each sub-node chassis is configured to be individually installed in the server system chassis when the server system chassis is mounted in the rack; and
   wherein each respective backplane mounted in a respective sub-node chassis is configured to allow communication between mass storage devices or server devices mounted in the respective sub-node chassis and mass storage devices or server devices mounted in another one of the sub-node chassis of the server node via one or more intra node connections between the respective backplane and a backplane mounted in the other sub-node chassis formed due to installation of the respective sub-node chassis or the other sub-node chassis.

2. The device of claim 1, further comprising:
   one or more intra node connectors coupled to the respective backplanes, wherein the one or more intra-node connectors are configured to couple with corresponding intra node connectors of one or more adjacent sub-node chassis to form the one or more intra node connections.

3. The device of claim 1, further comprising mass storage devices or server devices mounted in the respective ones of the sub-node chassis, wherein each of the sub-node chassis including the mass storage devices or server devices are configured to be manually lifted into and out of the server system chassis by a single person, when the server system chassis is mounted in the rack.

4. The device of claim 1, wherein respective ones of the sub-node chassis are positioned in the server system chassis such that an air space through the server system chassis is formed above or below adjacent ones of the respective sub-node chassis.

5. The device of claim 4, wherein each of the sub-node chassis of the server node comprise legs configured to elevate a body of the respective sub-node chassis above a surface of the server system chassis, wherein the respective ones of the multiple sub-node chassis of the server node comprise legs of different lengths such that the respective ones of the sub-node chassis of the server node are positioned at different elevations in the server system chassis.

6. The device of claim 4, wherein each of the sub-node chassis of the server node comprises a cover comprising rail guides mounted on the cover, wherein separate respective ones of the rail guides extend away from respective separate ones of the sub-node chassis covers by different respective distances such that the respective separate ones of the sub-node chassis are positioned at different elevations in the server system chassis.

7. The device of claim 1, further comprising a server device, wherein components of the server device are integrated into one of the backplanes.

8. The device of claim 1:
   wherein a given sub-node chassis of the plurality of sub-node chassis is configured to be removed from the server system chassis mounted in the rack,
   wherein the given sub-node chassis comprises a portion of an array of mass storage devices of the server node, and
   wherein the given sub-node chassis is configured to be individually removed from the server system chassis mounted in the rack while other sub-nodes of the server node remain in the server system chassis mounted in the rack.

9. The device of claim 8, further comprising:
   a cover of the given sub-node chassis configured to be removed to gain access to mass storage devices mounted in the removed sub-node chassis, wherein the cover comprises rail guides mounted on the cover, wherein the rail guides are configured to slide on rails mounted on the server system chassis.

10. The device of claim 8, wherein:
    the given sub-node chassis is configured for a mass storage device to be removed from the given sub-node chassis via an open corner of the given sub-node chassis in response to pressure applied to the mass storage device.

11. The device of claim 8, wherein:
    the given sub-node chassis is configured to be re-installed in the server system chassis mounted in the rack subsequent to removal; and
    an additional sub-node chassis is configured to be installed in the server system chassis mounted in the rack and couple with the re-installed sub-node chassis via one or more intra-node connectors.

12. The device of claim 11, further comprising:
feet of the sub-node chassis configured to slide on a bottom surface of the server system chassis to position the given sub-node chassis in the server system chassis when being re-installed.

13. The device of claim 11, wherein the given sub-node chassis has a tub configuration including:
a tub configured to slide on a bottom surface of the server system chassis to position the sub-node chassis in the server system chassis when being re-installed, wherein the tub comprises mass storage devices or server devices mounted at different elevations above a bottom surface of the server system chassis when mounted in the server system chassis.

14. A server system comprising:
a plurality of server nodes, each server node comprising:
a plurality of sub-node chassis configured to be individually inserted into a server system chassis mounted in a rack and removed from the server system chassis mounted in the rack,
wherein each sub-node chassis comprises an intra node connector configured to engage with an intra node connector of an adjacent sub-node chassis to allow communications between a sub-node comprising the sub-node chassis and an adjacent sub-node of the server node, and
wherein respective ones of the sub-node chassis are positioned in the server system chassis such that an air space through the server system chassis is formed above or below adjacent ones of the respective sub-node chassis.

15. The server system of claim 14, wherein each of the sub-node chassis further comprise a backplane mounted in the sub-node chassis, wherein the intra node connector of the respective sub-node chassis is coupled to the backplane.

16. The server system of claim 15, wherein each of the backplanes further comprises one or more openings that permit airflow through the respective backplane.

17. The server system of claim 14, wherein the air space above or below adjacent ones of the respective sub-node chassis increases across a respective server node and another air space above or below the adjacent ones of the respective sub-node chassis decreases across the respective server node.

18. The server system of claim 17, wherein the air space or the other air space forms a cold air plenum through which cool air is supplied to mass storage devices or server devices mounted in the respective sub-node chassis, and
wherein a different one of the air space or the other air space forms a warm air plenum through which air that has cooled the mass storage devices or the server devices flows away from the mass storage devices or the server devices.

19. The server system of claim 14, further comprising a server device and one or more mass storage devices mounted in one of the sub-node chassis, wherein the server device occupies up to an equivalent volume of space in the sub-node chassis as one of the mass storage devices mounted in the sub-node chassis.

20. The server system of claim 14, wherein at least two of the sub-node chassis are mounted in the server system adjacent to one another, wherein the intra node connectors of the at least two sub-node chassis are mounted on adjacent sides of the sub-node chassis.

* * * * *